United States Patent
Gan et al.

(10) Patent No.: US 8,837,183 B2
(45) Date of Patent: Sep. 16, 2014

(54) POWER SWITCH SERIES CIRCUIT AND CONTROL METHOD THEREOF

(75) Inventors: Hong-Jian Gan, Shanghai (CN); Jian-Ping Ying, Shanghai (CN); Jie Fu, Shanghai (CN); Wei-Liang Fu, Shanghai (CN); Ming Wang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 241 days.

(21) Appl. No.: 13/421,877

(22) Filed: Mar. 16, 2012

(65) Prior Publication Data
US 2013/0082762 A1    Apr. 4, 2013

(30) Foreign Application Priority Data
Sep. 29, 2011    (CN) .......................... 2011 1 0294720

(51) Int. Cl.
*H02M 7/44* (2006.01)
*H03K 17/10* (2006.01)
*H02H 7/22* (2006.01)
*H03K 17/082* (2006.01)

(52) U.S. Cl.
CPC .......... *H03K 17/0828* (2013.01); *H03K 17/107* (2013.01); *H02H 7/222* (2013.01)
USPC ........................................................ 363/98

(58) Field of Classification Search
USPC .............. 363/52, 53, 55, 56.02, 56.03, 56.04, 363/56.05, 56.07, 56.08, 98, 131, 132
See application file for complete search history.

(56) References Cited

U.S. PATENT DOCUMENTS

| 6,888,729 | B2 * | 5/2005 | Maekawa et al. .......... 363/56.02 |
| 2004/0252432 | A1 | 12/2004 | Sasaki et al. |

FOREIGN PATENT DOCUMENTS

| CN | 101174788 A | 5/2008 |
| CN | 201072860 Y | 6/2008 |
| CN | 101728952 A | 6/2010 |
| CN | 201570360 U | 9/2010 |
| CN | 102082418 A | 6/2011 |
| CN | 201898438 U | 7/2011 |
| WO | 9107013 A1 | 5/1991 |

\* cited by examiner

*Primary Examiner* — Adolf Berhane
*Assistant Examiner* — Afework Demisse
(74) *Attorney, Agent, or Firm* — CKC & Partners Co., Ltd.

(57) ABSTRACT

The present invention provides a power switch series circuit and its control method. The power switch series circuit includes a plurality of series modules, a control module and a drive module. At least one series module has a power switch and a detection module, and the detection module includes a detection unit and an isolation unit, so as to detect the overvoltage and output a voltage detection signal based on the detected voltage. The control module receives the voltage detection signal and outputs the corresponding control signal. The drive module amplifies the control signal to drive each power switch to turn ON or turn OFF. The control module outputs the corresponding control signal to turn off each power switch when the overvoltage happens.

34 Claims, 5 Drawing Sheets

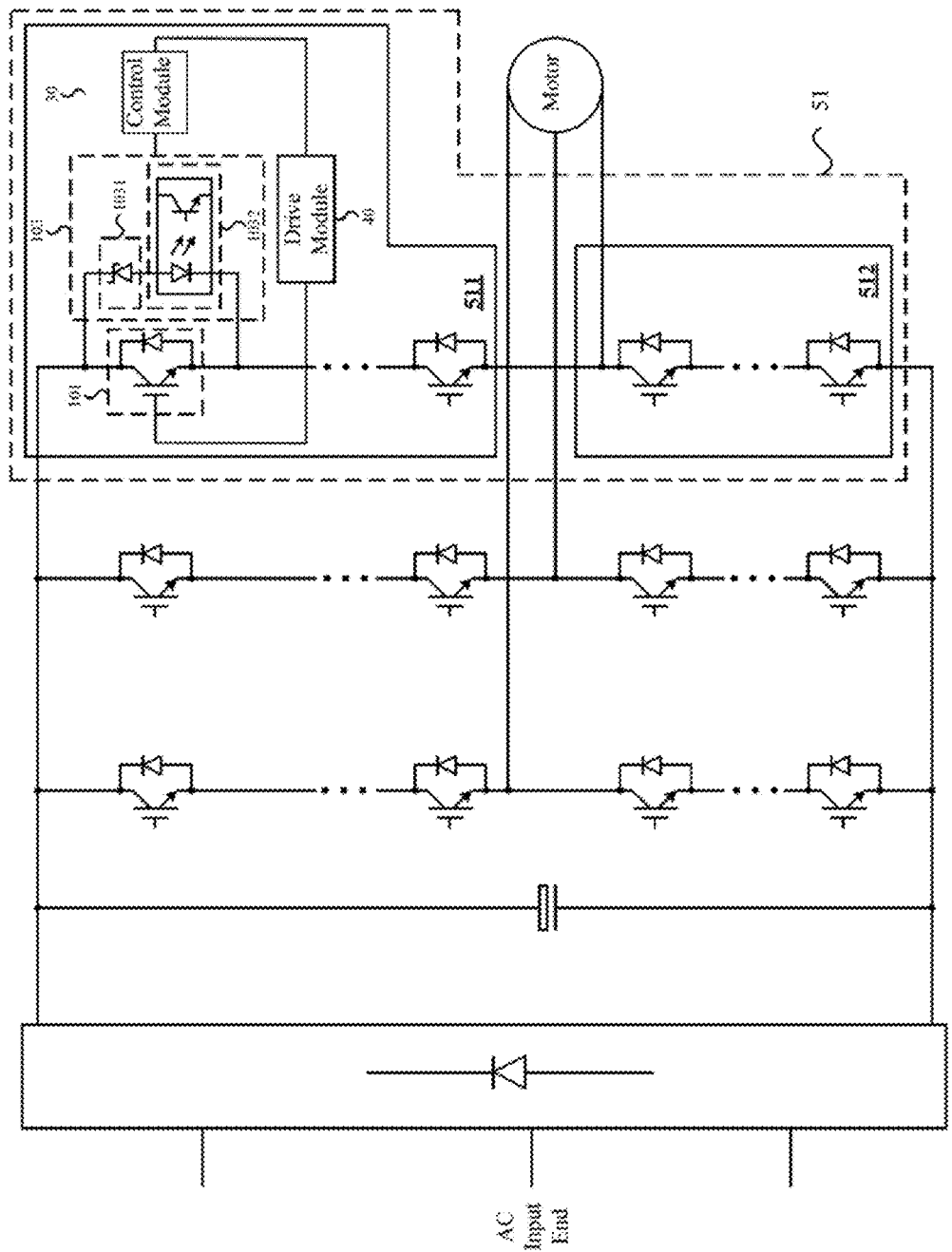

POWER SWITCH SERIES CIRCUIT AND CONTROL METHOD THEREOF

RELATED APPLICATIONS

This application claims priority to Chinese Application Serial Number 201110294720.X, filed Sep. 29, 2011, which is herein incorporated by reference.

BACKGROUND

1. Field of Invention

The present invention relates to a power switch series connection technique. More particularly, the present invention relates to a design of a power switch series circuit and a control method thereof.

2. Description of Related Art

Modern high voltage and high power converters require a power device having a high withstand voltage value. However, a single power device cannot meet this requirement. In one solution of the prior art, a plurality of power switch devices are directly connected in series. For example, the power switch device may be a thyristor, a GTO (Gate Turn-Off Thyristor) or an IGBT (Insulated Gate Bipolar Transistor), which may be applied in electronic equipment such as a high-voltage DC circuit, a SVC (Static Var Compensator) or a high-voltage inverter.

However, when a conventional device such as the thyristor or the GTO is employed for series connection, the power consumption is large and the switching speed is slow, and as a result, such a conventional device cannot be widely applied in a PWM current transformation apparatus. In comparison, the IGBT, which is a semiconductor power device introduced in the 1980's, has a voltage control input characteristic and a low-impedance on-state output characteristic, and the switching speed of the IGBT is fast. Consequently, the IGBT can fully satisfy the requirement of the PWM current transformation technique. On the other hand, although the IGBT index and the gate control signal circuit in the series circuit are totally the same, due to the fact that each IGBT has a different performance and switching speed, the parameters of the elements of the gate control signal circuit are not consistent and the circuit has distributed inductance and distributed capacitance, the switching actions of the IGBTs are not consistent. A negative consequence of this is that a voltage between a collector and an emitter exceeds a rated withstand voltage value when an individual IGBT device is switched, thereby damaging the power device.

In view of the above, many in the industry are endeavoring to find ways in which to improve the power switch series circuit of the prior art, so as to quickly protect the power switch when an abnormal situation is encountered with the circuit, thereby improving the operation reliability of the series circuit.

SUMMARY

The present invention provides a novel power switch series circuit and a control method thereof.

A technical aspect of the present invention relates to a power switch series circuit, and the power switch series circuit includes a plurality of series modules, a control module and a drive module. The adjacent series modules are connected in series by power switches thereof, and at least one of the plurality of series modules includes a power switch and a detection module.

The power switch has a first terminal, a second terminal connected to the power switch of an adjacent series module and a third terminal connected to the power switch of another adjacent series module. The detection module includes a detection unit for detecting if a voltage between the second terminal and the third terminal of the power switch is an overvoltage and an isolation unit for outputting a voltage detection signal based on the detected voltage. The control module is electrically connected to the isolation unit for receiving the voltage detection signal and outputting a control signal corresponding to the voltage detection signal. The drive module is electrically connected to the control module and to the first terminal of the power switch, the drive module amplifying the control signal to drive the power switch of each series module to turn ON or turn OFF. When the detected voltage detected by the detection module is higher than a first threshold voltage, the voltage detection signal is an overvoltage signal, and the control module outputs a control signal corresponding to the overvoltage signal, so as to turn OFF the power switch of each series module.

The isolation unit is an optical coupler. In some embodiments, the optical coupler includes a light-emitting semiconductor and a light-receiving semiconductor. The light-emitting semiconductor and the detection unit are connected in series, and the light-receiving semiconductor is connected to the control module. Furthermore, the optical coupler is a high-speed optical coupler.

When the voltage between the second terminal and the third terminal of the power switch is higher than the first threshold voltage, the detection unit is electrically turned ON to couple to the isolation unit.

At least one series module further includes a voltage balance module. The voltage balance module includes a resistor bridged across the second terminal and the third terminal of the power switch for making a static voltage balance on the power switch.

At least one series modules further includes a capacitor and a diode. The capacitor includes a first terminal and a second terminal. The diode includes a positive electrode and a negative electrode. The first terminal of the capacitor is coupled to the negative electrode of the diode, and the positive electrode of the diode and the second terminal of the capacitor are bridged across the second terminal and the third terminal of the power switch for making a dynamic voltage balance on the power switch.

At least one series module further includes a clamping circuit disposed between the capacitor and the detection module for clamping the voltage between the second terminal and the third terminal of the power switch to a second threshold voltage, in which the second threshold voltage is lower than the first threshold voltage.

The voltage detection signal is transmitted to the control module through an optical fiber.

Each of the plurality of series modules includes the detection module.

The control module includes a logic circuit having an input end electrically connected to the isolation unit of the detection module and an output end electrically connected to the drive module. In an embodiment, the logic circuit is a NOR gate circuit, and when the overvoltage signal of the at least one series module is at a high level, the output end of the logic circuit outputs a low level control signal to the drive module. In another embodiment, the logic circuit is an AND gate circuit, and when the overvoltage signal of the at least one series module is at a low level, the output end of the logic circuit outputs a low level control signal to the drive module.

The power switch is an IGBT (Insulated Gate Bipolar Transistor).

A technical aspect of the present invention relates to a control method of the abovementioned power switch series circuit. The method includes detecting the voltage between the second terminal and the third terminal of the power switch of the at least one series module, comparing the detected voltage and a threshold voltage, outputting a control signal within a predetermined time when the detected voltage is higher than the threshold voltage, and amplifying the control signal to drive the power switch of each series module to turn OFF.

The detected voltage and the control signal are isolated by an optical coupler.

The control signal is transmitted to the drive module through an optical fiber.

The power switch is an IGBT (Insulated Gate Bipolar Transistor).

A technical aspect of the present invention relates to a multilevel conversion apparatus. The multilevel conversion apparatus includes a three-phase H-bridge circuit, the three-phase H-bridge circuit including a plurality of bridge arms, each bridge arm having a first sub-bridge arm and a second sub-bridge arm. The first sub-bridge arm and the second sub-bridge arm are formed by one or more power switch series circuits according to one of the abovementioned aspects of the present invention.

The three-phase H-bridge circuit is a 2-level H-bridge or a 3-level H-bridge.

The first terminal of each power switch of the first sub-bridge arm is configured to receive a control signal, and the first terminal of each power switch of the second sub-bridge arm is configured to receive another control signal.

In the application of the power switch series circuit of the present invention, when the voltage between the second terminal and the third terminal of the power switch of any series module is an overvoltage, the control module outputs a control signal corresponding to the overvoltage signal to the drive module, so as to turn OFF the power switch of the overall series bridge arm. Hence, damage to the power switch due to the overvoltage is avoided, thereby improving the operation reliability of the power switch series circuit.

BRIEF DESCRIPTION OF THE DRAWINGS

Various aspects of the invention can be more clearly understood after reading the following specific embodiments of the embodiment, with reference to the accompanying drawings. In the drawings:

FIG. 5 is a schematic diagram of an application of the power switch series circuit of the present invention in a multilevel conversion apparatus.

DETAILED DESCRIPTION

Figure 1:
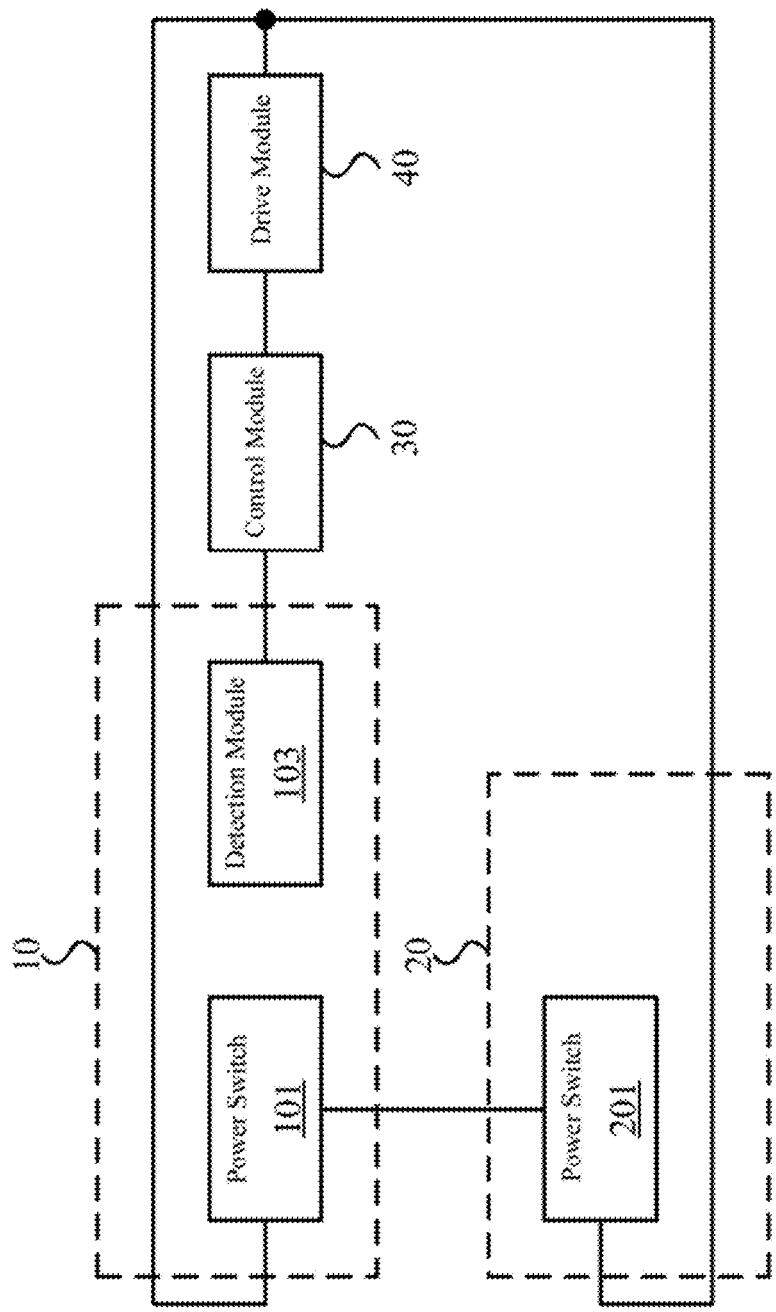
FIG. 1 is a schematic block diagram of a power switch series circuit according to an aspect of the present invention.

Specific embodiments of the present invention are further described in detail below with reference to the accompanying drawings.

In order to make the description of the present invention more detailed and more comprehensive, various embodiments are described below with reference to the accompanying drawings. The same reference numbers are used in the drawings to refer to the same or like elements. However, the embodiments described are not intended to limit the present invention. Moreover, it is not intended for the description of operation to limit the order of implementation. Any device with equivalent functions that is produced from a structure formed by a recombination of elements shall fall within the scope of the present invention.

The drawings are only illustrative and are not drawn to actual size. Additionally, well-known elements and steps are not described in the embodiments to avoid causing unnecessary limitations to the present invention.

FIG. 1 is a schematic block diagram of a power switch series circuit according to an aspect of the present invention. Referring to FIG. 1, the power switch series circuit of the present invention includes two series modules 10 and 20, a control module 30 and a drive module 40. The series modules 10 and 20 are connected in series by power switches 101 and 201 thereof, so as to form a power switch series bridge arm. In some embodiments, the power switches 101 and 201 are IGBTs (Insulated Gate Bipolar Transistor) of the same model. However, in other embodiments, each of the power switches 101 and 201 may be an IGCT (Integrated Gate Commutated Thyristor), an IEGT (Injection Enhanced Gate Transistor) or the like. The series module 10 includes the power switch 101 and a detection module 103. The series module 20 includes the power switch 201. Specifically, the power switch 101 has a first terminal, a second terminal and a third terminal. When the power switch 101 is, for example, an IGBT, the power switch 101 includes a gate, a collector and an emitter. The gate of the power switch 101 receives the drive signal from the drive module 40, so as to control the turning ON or turning OFF of the power switch 101. The collector of the power switch 101 is electrically connected to the emitter of the power switch of an adjacent series module. The emitter of the power switch 101 is electrically connected to the collector of the power switch of another adjacent series module (e.g., the collector of the power switch 201 of the series module 20).

The detection module 103 includes a detection unit for detecting if a voltage between the collector and the emitter of the power switch 101 is an overvoltage, and an isolation unit for outputting a voltage detection signal based on the detected voltage. In an embodiment, when the voltage between the collector and the emitter of the power switch 101 is higher than a first threshold voltage, the detection unit (referred to also as a passive detection element) is electrically turned ON to couple to the isolation unit. In another embodiment, the isolation unit is an optical coupler, which includes a light-emitting semiconductor and a light-receiving semiconductor. The light-emitting semiconductor and the detection unit are connected in series, and the light-receiving semiconductor is connected to the control module. When the optical coupler is a high-speed optical coupler, a voltage detection signal may be output quickly based on the detected voltage. For example, the voltage detection signal is output within a short predetermined time.

The control module 30 is electrically connected to the isolation unit of the detection module 103 for receiving the voltage detection signal from the isolation unit and outputting a control signal corresponding to the voltage detection signal. The drive module 40 is electrically connected to the control module 30 for amplifying the control signal to drive the power switches 101 and 201 of the series modules 10 and 20 to turn ON or turn OFF. When the detected voltage of the detection module 103 of the series module 10 is higher than the first threshold voltage (e.g., an overvoltage protection threshold voltage), the voltage detection signal is an overvoltage signal, and the control module 30 outputs a control signal corresponding to the overvoltage signal to drive the power switch 101 of the series module 10 and the power switch 201 of the series module 20 to turn OFF through the drive module 40.

In a specific embodiment, when the detected voltage of the detection module 103 is higher than the first threshold voltage, the detection module 103 outputs an overvoltage signal to the control module 30, and then the control module 30 generates a control signal based on the received overvoltage signal. At this time, after being amplified by the drive module 40, the control signal is sent to the gate of the power switch 101 of the series module 10 with an overvoltage failure and also sent to the gate of the power switch 201 of the series module 20 without the overvoltage failure, thereby ensuring turning OFF of the power switches 101 and 201 in a synchronized manner. In some embodiments, in the present invention, a detection module identical to the detection module 103 may be disposed in each series module to ensure the control module 30 can output a control signal when the power switch of any series module has the overvoltage, so as to turn OFF all the power switches in the power switch series circuit in a synchronized manner, thereby greatly improving the reliability of the power switch series circuit.

In another specific embodiment, the control module 30 includes a logic circuit having an input end electrically connected to the detection module 103 of the series module 10 and an output end electrically connected to the drive module 40. For example, the logic circuit is a NOR gate circuit, and when the overvoltage signal of the detection module 103 of the series module 10 is at a high level, the output end of the logic circuit outputs a low level control signal to the drive module 40. In another example, the logic circuit is an AND gate circuit, and when the overvoltage signal of the detection module 103 of the series module 10 is at a low level, the output end of the logic circuit outputs a low level control signal to the drive module 40.

It would be understood by those skilled in the art that while the power switch series circuit in FIG. 1 includes the series module 10 and the series module 20, the present invention is not limited to including two series modules. For example, in other embodiments, the power switch series circuit of the present invention may also include three or more series modules, and such a configuration also falls within the spirit and scope of the present invention. Furthermore, in the power switch circuit in FIG. 1, only the series module 10 includes the detection module 103 for overvoltage protection, but the present invention is not limited in this regard. For example, in other embodiments, each series module of the power switch series circuit of the present invention may have a detection module, so as to turn OFF all power switches on the series bridge arm in a synchronized manner by detecting if the voltage between the second terminal and the third terminal of any power switch on the series bridge arm is the overvoltage.

Figure 2:
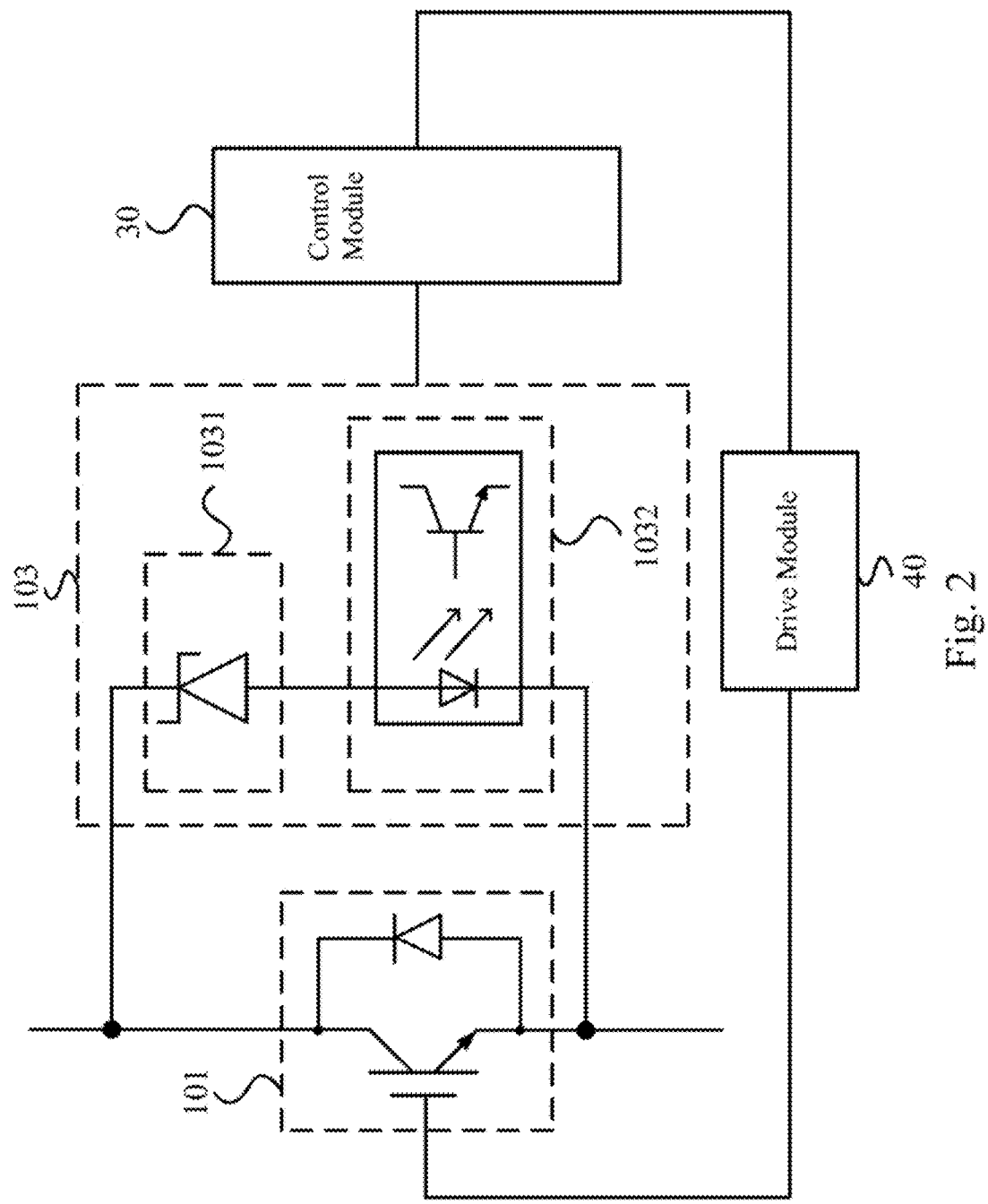
FIG. 2 is a schematic diagram of a detection module of the power switch series circuit in FIG. 1.

FIG. 2 is a schematic diagram of the detection module of the power switch series circuit in FIG. 1. Referring to FIG. 2, the series module 10 for example includes a power switch 101 and a detection module 103. The detection module 103 includes a detection unit 1031 and an isolation unit 1032. In some embodiments, the detection unit 1031 is a TVS (transient voltage suppressor) diode or a voltage stabilizing diode, and functions to detect if the voltage between the collector and the emitter of the power switch 101 is the overvoltage. In another example, the isolation unit 1032 is an optical coupler, and functions to quickly output a voltage detection signal based on the detected voltage. The isolation unit 1032 may transmit the voltage detection signal to the control module 30 through an optical fiber.

In a specific embodiment, the optical coupler includes a light-emitting semiconductor and a light-receiving semiconductor. The light-emitting semiconductor and the detection unit 1031 are connected in series, and the light-receiving semiconductor is connected to the control module 30. For example, in FIG. 2, the light-emitting semiconductor is a light-emitting diode and the light-receiving semiconductor is a transistor.

In another specific embodiment, the isolation unit 1032 of the detection module 103 quickly outputs a voltage detection signal, and the voltage detection signal is transmitted to the control module 30 through an optical fiber.

Figure 3:
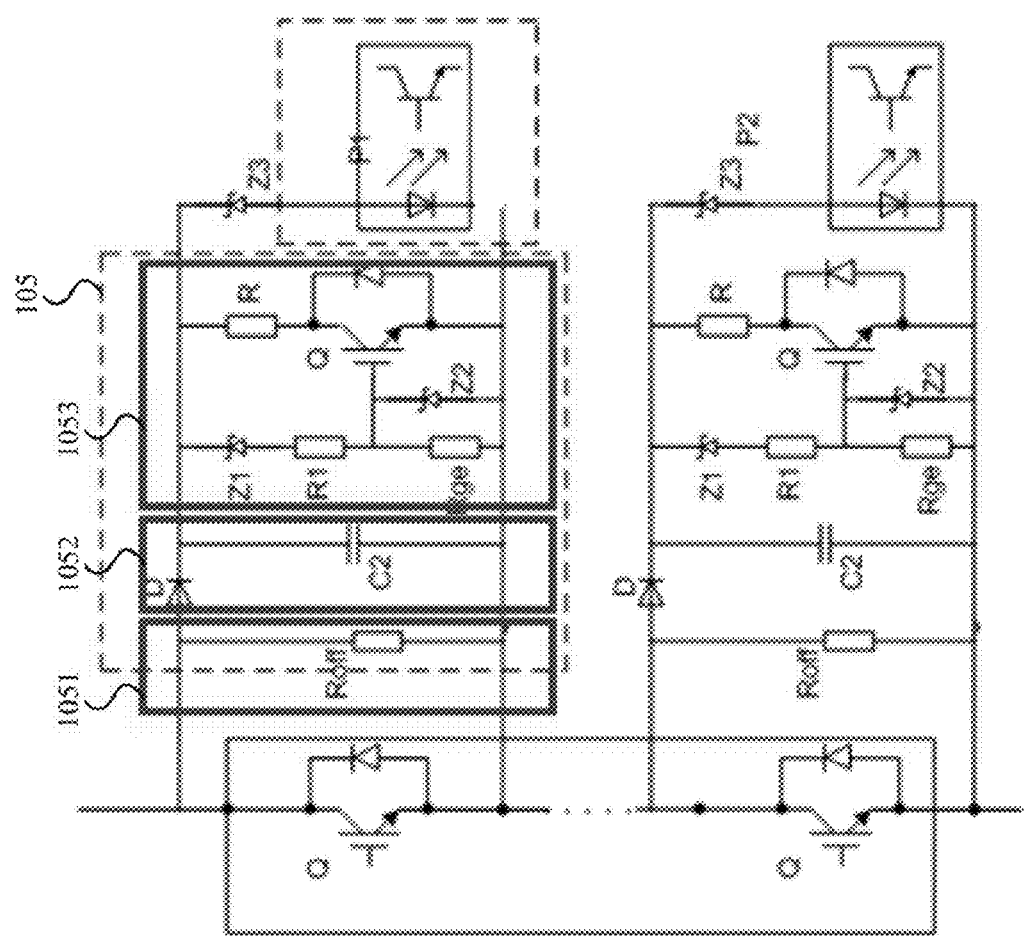
FIG. 3 is a schematic circuit diagram of a voltage balance module included in the power switch series circuit in FIG. 1.

FIG. 3 is a schematic circuit diagram of a voltage balance module of the power switch series circuit in FIG. 1. Referring to FIG. 3, the series module 10 for example includes a power switch 101, a detection module 103 and a voltage balance module 105.

The voltage balance module 105 is electrically connected to the power switch 101 and the detection module 103. In an embodiment, the voltage balance module 105 includes a static voltage balance circuit 1051. In another embodiment, the voltage balance module 105 includes a dynamic voltage balance circuit 1052. In still another embodiment, the voltage balance module 105 includes a clamping circuit 1053. In some embodiments, the static voltage balance circuit 1051 is a resistor Roff bridged across the second terminal and the third terminal of the power switch 101 for making the static voltage balance on the power switch 101. In some embodiments, the dynamic voltage balance circuit 1052 is a capacitor C2 bridged across the second terminal and the third terminal of the power switch 101 or connected to the second terminal of the power switch 101 by a diode D. The dynamic voltage balance circuit 1052 balances the dynamic voltage on the power switch 101. In some embodiments, the clamping circuit 1053 is disposed between the capacitor C2 and the detection module 103, and functions to clamp the voltage between the second terminal and the third terminal of the power switch 101 to a second threshold voltage. For example, the voltage between the second terminal and the third terminal of the power switch 101 may be the voltage across two ends of the capacitor C2, in which the second threshold voltage is lower than the first threshold voltage. That is, when the voltage between the second terminal and the third terminal of the power switch 101 is slightly higher than the second threshold voltage, the clamping circuit 1053 may clamp the voltage to the second threshold voltage. When the voltage keeps rising and becomes higher than the first threshold voltage, the detection unit (e.g., the TVS diode) of the detection module 103 detects that the power switch 101 has the overvoltage, and then the control module 30 turns OFF all power switches on the bridge arm.

It should be noted that the power devices of the series circuit have inconsistent blocking characteristics, which cause a static voltage unbalance of the power devices. The power devices of the series circuit have inconsistent switching characteristics, which cause a dynamic voltage unbalance. Hence, resistors with identical resistance are connected in parallel between the collector and the emitter of each IGBT on the series bridge arm (for example, a resistor R1 is connected in parallel between the collector and the emitter of the power switches 101 and 201 of the series modules 10 and 20), thereby effectively realizing the static voltage balance. In addition, due to the characteristic that the voltage across two ends of a capacitor cannot change instantly, the dynamic voltage balance of the power switch may be significantly improved.

Figure 4:
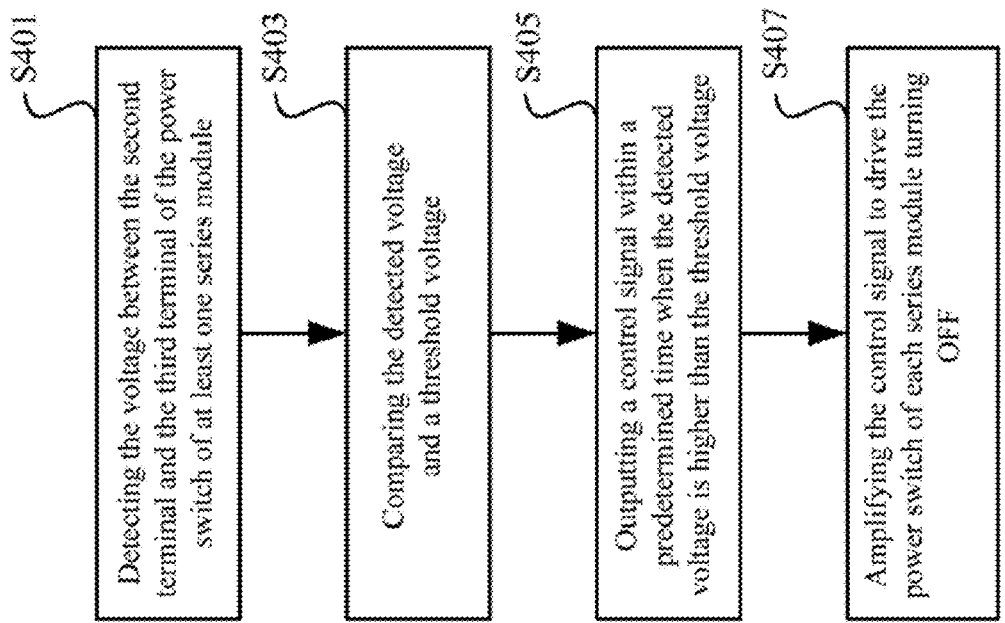
FIG. 4 is a flow chart of a control method of the power switch series circuit according to an aspect of the present invention.

FIG. 4 is a flow chart of a control method of a power switch series circuit according to an aspect of the present invention. According to this method, in step S401, the voltage between the second terminal and the third terminal of the power switch of at least one series module is detected. Subsequently, in step S403, the detected voltage and a threshold voltage are compared. Next, in steps S405 and S407, when the detected voltage is higher than the threshold voltage, a control signal is quickly output within a predetermined time, and the control signal is amplified to drive the power switch of each series module to turn OFF. As described above, when any series module of the power switch series circuit has the overvoltage, after the overvoltage signal quickly output by the detection module is processed by the control module, the control signal output by the control module is sent to the gate of the power switch of each series module by a drive module block.

FIG. 5 is a schematic diagram of an application of the power switch series circuit of the present invention in a multilevel conversion apparatus. Referring to FIG. 5, the multilevel conversion apparatus includes an H-bridge circuit. The H-bridge circuit has three bridge arms, and each bridge arm is divided into an upper bridge arm and a lower bridge arm. The first bridge arm 51 for example includes an upper bridge arm 511 and a lower bridge arm 512. The upper bridge arm 511 is formed by the power switch series circuit of the present invention, so as to be equivalent to a single high-voltage semiconductor device, and the lower bridge arm 512 is formed by the aforementioned power switch series circuit of the present invention, so as to be equivalent to another single high-voltage semiconductor device. When the H-bridge circuit is electrically connected to a three-phase motor, each output end of the three bridge arms of the H-bridge circuit is electrically connected to a corresponding phase of the motor. As an example, the output terminal of the first bridge arm of the H-bridge circuit is electrically connected to an A-phase winding of the three-phase motor, the output terminal of the second bridge arm is electrically connected to a B-phase winding of the three-phase motor, and the output terminal of the third bridge arm is electrically connected to a C-phase winding of the three-phase motor.

It would be understood by those skilled in the art that for the same bridge arm, the upper bridge arm 511 or the lower bridge arm 512 may also include two or more power switch series circuits, and the power switch series circuits are connected in series. In other words, the upper bridge arm 511 or the lower to bridge arm 512 may include an equivalent high-voltage semiconductor device and another equivalent high-voltage semiconductor device connected in series.

In the application of the power switch series circuit of the present invention, when the voltage between the second terminal and the third terminal of the power switch of any series module is the overvoltage, the control module outputs a control signal corresponding to the overvoltage signal to the drive module, so as to turn OFF the power switch of the overall series bridge arm. As a result, damage to the power switch due to the overvoltage is avoided, thereby improving the operation reliability of the power switch series circuit. Meanwhile, the detection module of the power switch series circuit of the present invention is simple and easy to implement, and has a quick speed and high reliability, which can quickly and effectively detect a failure signal, so as to control the IGBT.

Although the present invention has been disclosed with reference to the above embodiments, these embodiments are not intended to limit the present invention. It will be apparent to those skilled in the art that various modifications and variations can be made without departing from the scope and spirit of the present invention. Therefore, the scope of the present invention shall be defined by the appended claims.

What is claimed is:

1. A power switch series circuit, comprising:
a first series module comprising a first power switch;
a second series module adjacent to the first series module, comprising:
a second power switch having a first terminal, a second terminal connected to the first power switch and a third terminal connected to a third power switch of a third series module adjacent to the second series module, wherein the first series module, the second series module and the third series module are connected in series by a connection of the first power switch, the second power switch and the third power switch; and
a detection module comprising a detection unit for detecting if a detected voltage between the second terminal and the third terminal of the second power switch is an overvoltage and an isolation unit for outputting a voltage detection signal based on the detected voltage;
a control module electrically connected to the isolation unit for receiving the voltage detection signal and outputting a control signal corresponding to the voltage detection signal; and
a drive module electrically connected to the control module, the first terminal of the second power switch, the first power switch and the third power switch, the drive module amplifying the control signal to drive the first power switch, the second power switch and the third power switch to turn ON or turn OFF;
wherein when the detected voltage is higher than a first threshold voltage, the voltage detection signal is the overvoltage signal, and the control module outputs the control signal corresponding to the overvoltage signal, so as to turn OFF the first power switch, the second power switch and the third power switch.

2. The power switch series circuit of claim 1, wherein the isolation unit is an optical coupler.

3. The power switch series circuit of claim 1, wherein when the detected voltage between the second terminal and the third terminal of the second power switch is higher than the first threshold voltage, the detection unit is electrically turned ON to couple to the isolation unit.

4. The power switch series circuit of claim 1, wherein the second series module further comprises a voltage balance module, and the voltage balance module comprises:
a resistor bridged across the second terminal and the third terminal of the second power switch for making a static voltage balance on the second power switch.

5. The power switch series circuit of claim 1, wherein the second series module further comprises a capacitor and a diode, the capacitor comprises a first terminal and a second terminal, the diode comprises an anode and a cathode, the first terminal of the capacitor is coupled to the cathode of the diode, and the anode of the diode and the second terminal of the capacitor are bridged across the second terminal and the third terminal of the second power switch for making a dynamic voltage balance on the second power switch.

6. The power switch series circuit of claim 5, wherein the second series module further comprises a clamping circuit disposed between the capacitor and the detection module for clamping the detected voltage between the second terminal and the third terminal of the second power switch to a second threshold voltage, wherein the second threshold voltage is lower than the first threshold voltage.

7. The power switch series circuit of claim 2, wherein the optical coupler comprises a light-emitting semiconductor and a light-receiving semiconductor, the light-emitting semiconductor and the detection unit are connected in series, and the light-receiving semiconductor is connected to the control module.

8. The power switch series circuit of claim 7, wherein the optical coupler is a high-speed optical coupler.

9. The power switch series circuit of claim 1, wherein the voltage detection signal is transmitted to the control module through an optical fiber.

10. The power switch series circuit of claim 1, wherein the first series module further comprises the detection module.

11. The power switch series circuit of claim 1, wherein the control module comprises a logic circuit having an input end electrically connected to the isolation unit of the detection module and an output end electrically connected to the drive module.

12. The power switch series circuit of claim 11, wherein the logic circuit is a NOR gate circuit, and when the overvoltage signal of the second series module is at a high level, the output end of the logic circuit outputs a low level control signal to the drive module.

13. The power switch series circuit of claim 11, wherein the logic circuit is an AND gate circuit, and when the overvoltage signal of the second series module is at a low level, the output end of the logic circuit outputs a low level control signal to the drive module.

14. The power switch series circuit of claim 1, wherein the first power switch and the second power switch are IGBTs.

15. A control method of the power switch series circuit of claim 1, comprising:
   detecting the detected voltage between the second terminal and the third terminal of the second power switch of the second series module;
   comparing the detected voltage and the first threshold voltage;
   outputting a control signal within a predetermined time when the detected voltage is higher than the first threshold voltage; and
   amplifying the control signal to drive the first power switch, the second power switch and the third power switch to turn OFF.

16. The method of claim 15, wherein the detected voltage and the control signal are isolated by an optical coupler.

17. The method of claim 15, wherein the control signal is transmitted to the drive module through an optical fiber.

18. The method of claim 15, wherein the first power switch and the second power switch are IGBTs.

19. A multilevel conversion apparatus, comprising a three-phase H-bridge circuit with each bridge arm having a first sub-bridge arm and a second sub-bridge arm, wherein
   the first sub-bridge arm and the second sub-bridge arm are formed by power switch series circuits, respectively, wherein each of the power switch series circuits comprise:
   a first series module, comprising a first power switch;
   a second series module adjacent to the first series module, comprising:
      a second power switch having a first terminal, a second terminal connected to the first power switch and a third terminal connected to a third power switch of a third series module adjacent to the second series module, wherein the first series module, the second series module and the third series module are connected in series by a connection of the first power switch, the second power switch and the third power switch; and
      a detection module comprising a detection unit for detecting if a detected voltage between the second terminal and the third terminal of the second power switch is an overvoltage and an isolation unit for outputting a voltage detection signal based on the detected voltage;
   a control module electrically connected to the isolation unit for receiving the voltage detection signal and outputting a control signal corresponding to the voltage detection signal; and
   a drive module electrically connected to the control module and the first terminal of the second power switch, the first power switch and the third power switch, the drive module amplifying the control signal to drive the first power switch, the second power switch and the third power switch to turn ON or turn OFF;
   wherein when the detected voltage is higher than a first threshold voltage, the voltage detection signal is overvoltage signal, and the control module outputs the control signal corresponding to the overvoltage signal, so as to turn OFF the first power switch, the second power switch and the third power switch.

20. The multilevel conversion apparatus of claim 19, wherein the isolation unit is an optical coupler.

21. The multilevel conversion apparatus of claim 19, wherein when the detected voltage between the second terminal and the third terminal of the second power switch is higher than the first threshold voltage, the detection unit is electrically turned ON to couple to the isolation unit.

22. The multilevel conversion apparatus of claim 19, wherein the second series module further comprises a voltage balance module, and the voltage balance module comprises:
   a resistor bridged across the second terminal and the third terminal of the second power switch for making a static voltage balance on the second power switch.

23. The multilevel conversion apparatus of claim 19, wherein the second series module further comprises a capacitor and a diode, the capacitor comprises a first terminal and a second terminal the diode comprises an anode and a cathode, the first terminal of the capacitor is coupled to the cathode of the diode, and the anode of the diode and the second terminal of the capacitor are bridged across the second terminal and the third terminal of the second power switch for making a dynamic voltage balance on the second power switch.

24. The multilevel conversion apparatus of claim 23, wherein the second series module further comprises a clamping circuit disposed between the capacitor and the detection module for clamping the detected voltage between the second terminal and the third terminal of the second power switch to a second threshold voltage, wherein the second threshold voltage is lower than the first threshold voltage.

25. The multilevel conversion apparatus of claim 20, wherein the optical coupler comprises a light-emitting semiconductor and light-receiving semiconductor, the light-emitting semiconductor and the detection unit are connected in series, and the light-receiving semiconductor is connected to the control module.

26. The multilevel conversion apparatus of claim 25, wherein the optical coupler is a high-speed optical coupler.

27. The multilevel conversion apparatus of claim 19, wherein the voltage detection signal is transmitted to the control module through an optical fiber.

28. The multilevel conversion apparatus of claim 19, wherein the first series module further comprises the detection module.

29. The multilevel conversion apparatus of claim 19, wherein the control module comprises a logic circuit having an input end electrically connected to the isolation unit of the detection module and an output end electrically connected to the drive module.

30. The multilevel conversion apparatus of claim 29, wherein the logic circuit is a NOR gate circuit, and when the overvoltage signal of the second series module is at a high level, the output end of the logic circuit outputs a low level control signal to the drive module.

31. The multilevel conversion apparatus of claim 29, wherein the logic circuit is an AND gate circuit, and when the overvoltage signal of the second series module is at a low level, the output end of the logic circuit outputs a low level control signal to the drive module.

32. The multilevel conversion apparatus of claim 19, wherein the first power switch and the second power switch are IGBTs.

33. The multilevel conversion apparatus of claim 19, wherein the three-phase H-bridge circuit is a 2-level H-bridge or a 3-level H-bridge.

34. The multilevel conversion apparatus of claim 19, wherein the first terminal of the second power switch of the first sub-bridge arm is electrically connected to the drive module of the first sub-bridge arm, and the first terminal of the second power switch of the second sub-bridge arm is electrically connected to the drive module of the second sub-bridge arm.

* * * * *